United States Patent
Han

(10) Patent No.: US 7,507,626 B2
(45) Date of Patent: Mar. 24, 2009

(54) FLOATING GATE OF FLASH MEMORY DEVICE AND METHOD OF FORMING THE SAME

(75) Inventor: Chang Hun Han, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 61 days.

(21) Appl. No.: 11/647,021

(22) Filed: Dec. 27, 2006

(65) Prior Publication Data

US 2007/0145461 A1 Jun. 28, 2007

(30) Foreign Application Priority Data

Dec. 28, 2005 (KR) .................. 10-2005-0132652

(51) Int. Cl.
*H01L 21/336* (2006.01)

(52) U.S. Cl. .............. 438/257; 438/207; 438/261; 438/266; 438/303; 257/E21.209

(58) Field of Classification Search .............. None
See application file for complete search history.

(56) References Cited

U.S. PATENT DOCUMENTS

| 5,174,857 | A | * | 12/1992 | Sung | ............................ 216/48 |
| 5,940,706 | A | * | 8/1999 | Sung et al. | .................. 438/261 |
| 6,656,796 | B2 | * | 12/2003 | Chan et al. | .................. 438/266 |

* cited by examiner

*Primary Examiner*—N Drew Richards
*Assistant Examiner*—Kyoung Lee
(74) *Attorney, Agent, or Firm*—Andrew D. Fortney

(57) ABSTRACT

Disclosed is a floating gate of a flash memory device, wherein a tunneling oxide layer is formed on a semiconductor substrate, and a floating gate is formed in the shape of a lens having a convex top surface.

13 Claims, 3 Drawing Sheets

FLOATING GATE OF FLASH MEMORY DEVICE AND METHOD OF FORMING THE SAME

BACKGROUND OF THE INVENTION

1. Field of the Invention

The present invention relates to a floating gate and a method of forming the same.

2. Description of the Related Art

A flash memory is a kind of nonvolatile memory. Applications of the flash memory have been extended, and a chip integration density of the flash memory has also been improved.

Products in which a flash memory is embedded in a general logic have been applied in various fields. Accordingly, it is a problem to reduce manufacturing costs and power consumption.

To reduce manufacturing costs, a chip size must be reduced and a process must be simplified. However, the chip size has been currently reduced down to 0.10 μm with the rapid development of a photo process in accordance with a design rule.

Further, production costs can be reduced not only by simplifying a process but also by eliminating a process in which failure may occur in view of a yield.

Meanwhile, in a design of a flash memory device, a floating gate requires high capacitance for the purpose of coupling a higher floating gate voltage from a control gate.

As a method for obtaining high capacitance as described above, there are methods of increasing an overlap between floating and control gates, utilizing a material with an interlayer dielectric constant, reducing the thickness of an interlayer dielectric layer, and the like.

The method of utilizing a material with an interlayer dielectric constant or reducing the thickness of an interlayer dielectric layer has a disadvantage in that a leakage current is large.

Therefore, the method of increasing an overlap between floating and control gates is mainly used to obtain high capacitance. However, the method of increasing an overlapping area has a disadvantage in that a cell area is increased.

As a method for solving these disadvantages, there is a method of increasing an overlapping area of a sidewall rather than that of a plan, which causes many problems in view of planarization.

One of such area increasing methods is a method of allowing the shape of a floating gate to be uneven.

That is, there is a method in which a floating gate is primarily formed, and a mask process is then performed such that the interior of the floating gate is removed by a predetermined thickness, thereby allowing the shape of the floating gate to be uneven.

In this case, the capacitance of a floating gate is increased in accordance with the increase of an area due to unevenness, and thus the coupling ratio of a flash memory is increased.

However, there is a problem in that a mask process must be performed twice in such a method, i.e., a process is complicated and manufacturing costs are increased.

SUMMARY OF THE INVENTION

The present invention has been made to solve the above mentioned problem(s), and it is an object of the present invention to provide a floating gate of a flash memory device and a method of forming the same, wherein the area of the floating gate is extended, and a coupling ratio is increased.

According to one aspect of the present invention, there is provided a floating gate of a flash memory device, wherein a tunneling oxide layer is formed on a semiconductor substrate, and a floating gate is formed in the shape of a lens having a convex top surface.

According to another aspect of the present invention, there is provided a method of forming a floating gate in a flash memory device, which includes the steps of: forming a tunneling oxide layer on a semiconductor substrate; forming a conductive layer on the tunneling oxide layer; coating a photoresist layer on the conductive layer and then selectively patterning the photoresist layer, thereby defining a floating gate area; selectively removing the conductive layer by a predetermined thickness from a top surface of the conductive layer by using the patterned photoresist layer as a mask; performing a thermal process with respect to the photoresist layer, thereby, reflowing the photoresist layer with the shape of a lens having a convex top surface; and simultaneously etching the photoresist layer subjected to reflowing and the conductive layer, thereby forming a floating gate with the shape of a lens having a convex top surface.

DETAILED DESCRIPTION OF THE INVENTION

Hereinafter, a floating gate of a flash memory device and a method of forming the same according to the present invention will be described in detail with reference to the accompanying drawings.

Figure 1:
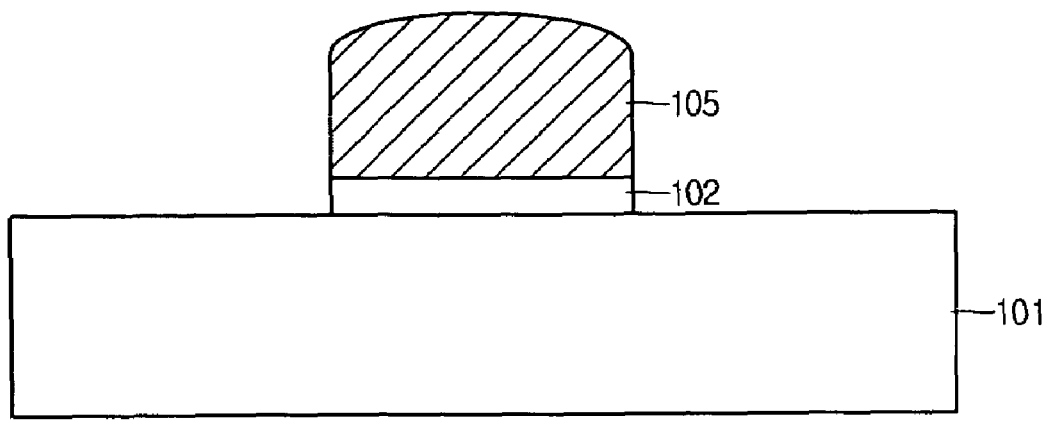
FIG. 1 is a sectional view showing a floating gate of a flash memory device according to the present invention.

FIG. 1 is a sectional view showing a floating gate of a flash memory device according to the present invention.

As shown in FIG. 1, a tunneling oxide layer 102 is formed on a semiconductor substrate 101, and a floating gate is formed in the shape of a lens having a convex top surface.

FIGS. 2A to 2E are sectional views illustrating a process of forming a floating gate in a flash memory device according to the present invention.

Figure 2A:
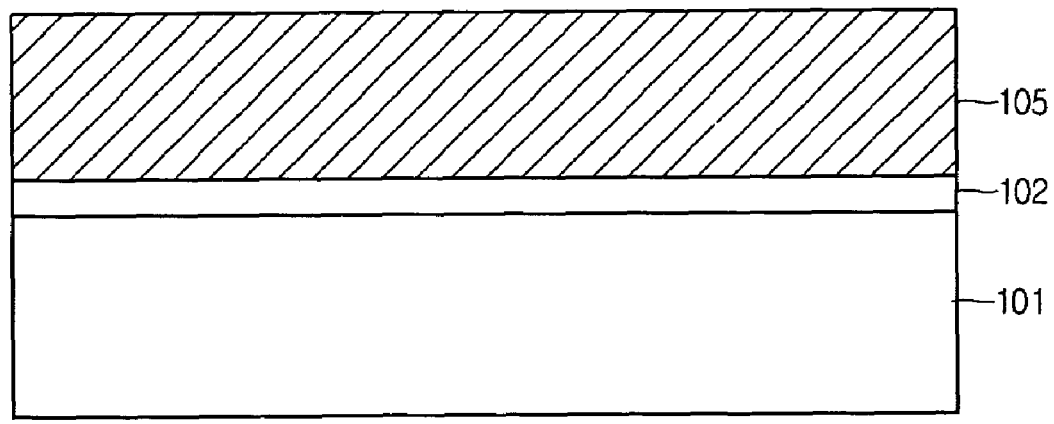
FIGS. 2A to 2E are sectional views illustrating a process of forming a floating gate in a flash memory device according to the present invention.

As shown in FIG. 2A, a tunneling oxide layer 102 is formed in a thickness of 80 to 120 Å on a semiconductor substrate 101, and a poly-silicon layer 103 is formed in a thickness of 900 to 1100 Å on the tunneling oxide layer 102.

Here, the poly-silicon 103 may be formed by allowing the thickness of the poly-silicon layer 103 to be adjusted depending on etching selectivity with a photoresist layer to be coated later.

Figure 2B:
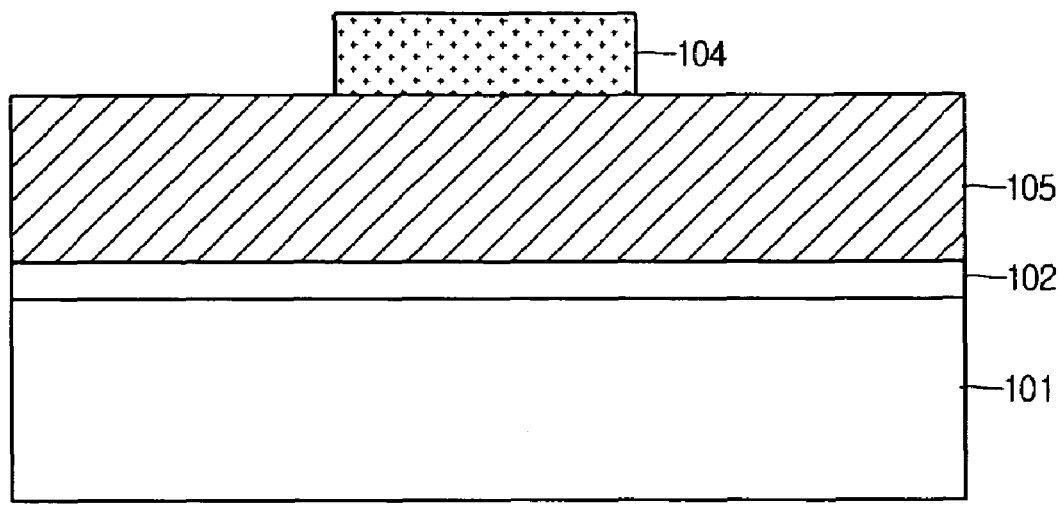

As shown in FIG. 2B, a photoresist layer 104 is coated on an entire surface of the semiconductor substrate 101 having the poly-silicon layer 103, and the photoresist layer 104 is selectively patterned through an exposure and development process, thereby defining a floating gate area.

Here, after the photoresist layer 104 has been coated, an antireflective coating (not shown) may be formed in a thickness of about 600 Å.

Meanwhile, in a method of coating the photoresist layer 104, there are methods of spin coat, spray coat, dip coat and the like. However, the spin coat performed while chucking and rotating a wafer at a high speed under a vacuum atmosphere is advantageous to stability and uniformity.

Then, a photo mask (not shown) corresponding to a desired pattern is positioned on the photoresist layer 104, and a photoresist pattern is then formed to have a desired size through exposure and development processes.

Here, the development process is performed through deposition or spraying. In the former, it is difficult to manage a temperature, a density, a change in time and the like, while, in the latter, it is relatively easy to manage. Currently, an apparatus subjected to in-line through a spraying scheme has been widely used.

Figure 2C:
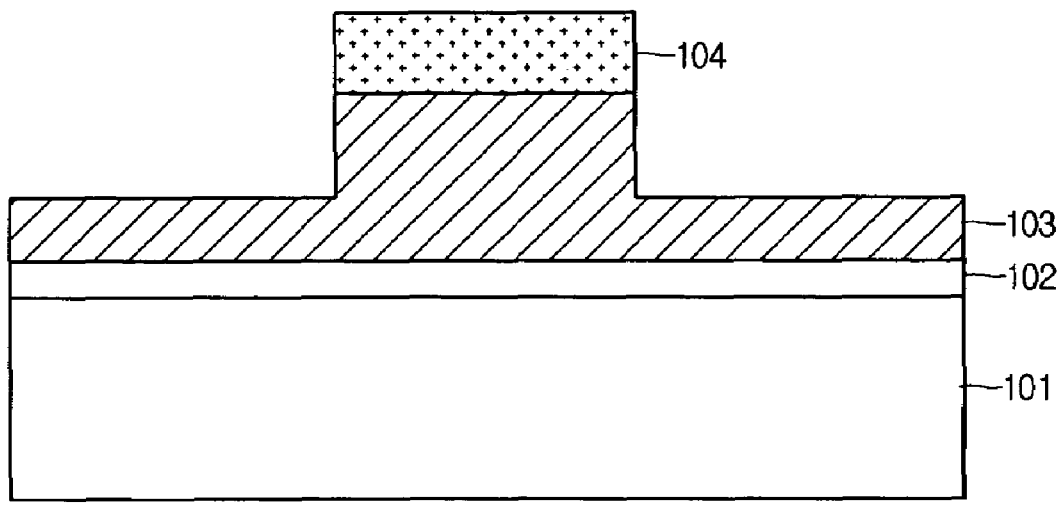

As shown in FIG. 2C, the poly-silicon layer 103 is selectively removed by a predetermined thickness from a top surface thereof by using the patterned photoresist layer 104 as a mask.

Here, the thickness of the poly-silicon layer 103 removed by the predetermined thickness is about ½ of the original thickness of the poly-silicon layer 103.

Figure 2D:
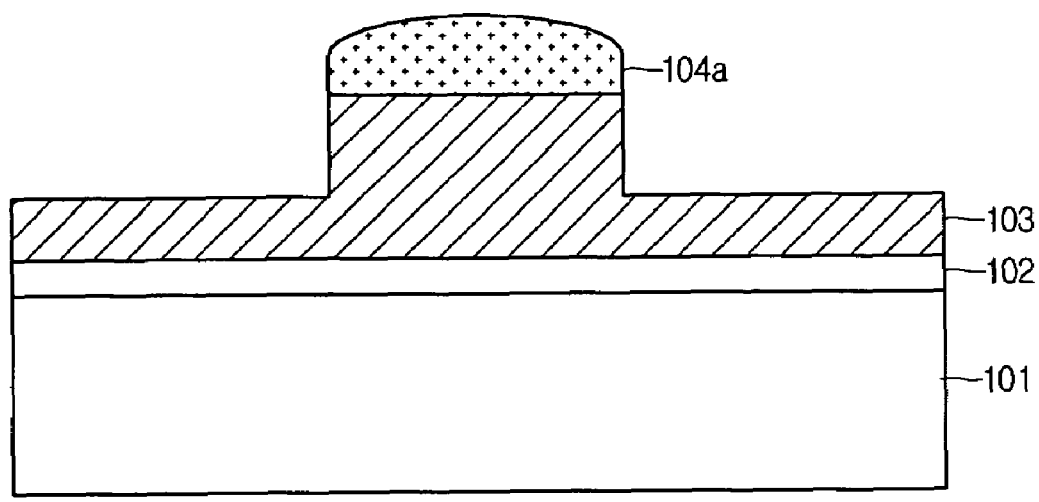

As shown in FIG. 2D, a thermal process is performed with respect to the photoresist layer 104 such that the photoresist layer 104 is subjected to reflowing, thereby forming a photoresist layer 104a with the shape of a lens having a convex top surface.

Figure 2E:
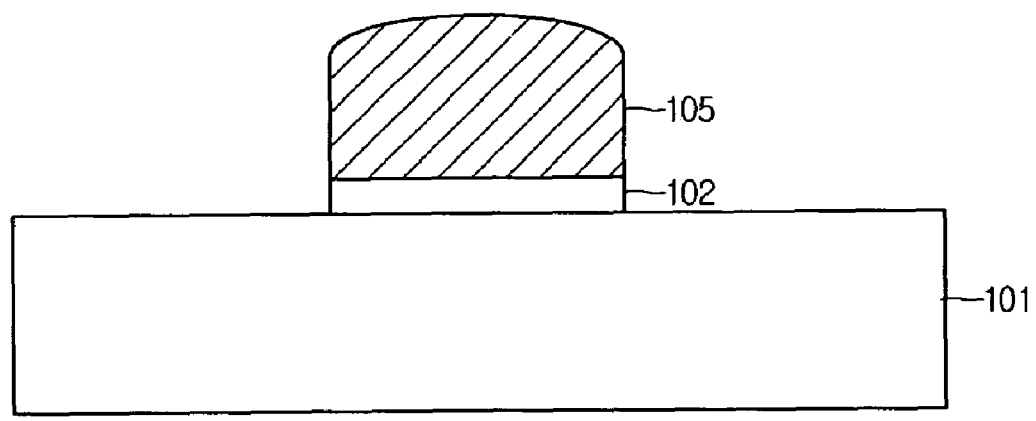

As shown in FIG. 2E, the photoresist layer 104 subjected to reflowing and the residual poly-silicon layer 103 are simultaneously etched at etching selectivity of 1:1, thereby forming a floating gate 105 with the shape of a lens having a convex top surface.

Subsequently, after the floating gate 105 has been formed, the residual photoresist layer 104 and impurities are removed, and a washing process is performed.

As described above, a floating gate of a flash memory device and a method of forming the same according to the present invention have advantages as follows.

That is, a floating gate is formed in the shape of a lens having a convex top surface through a simple process, so that the area of the floating gate can be extended, and a coupling ratio can be increased.

It will be apparent to those skilled in the art that various modifications and variations can be made in the present invention. Thus, it is intended that the present invention covers the modifications and variations thereof within the scope of the appended claims.

What is claimed is:

1. A method of forming a floating gate in a flash memory device, the method comprising the steps of:
    forming a tunneling oxide layer on a semiconductor substrate;
    forming a conductive layer on the tunneling oxide layer;
    coating a photoresist layer on the conductive layer and then selectively patterning the photoresist layer, thereby defining a floating gate area;
    selectively removing a predetermined thickness of a top surface of the conductive layer using the patterned photoresist layer as a mask;
    reflowing the photoresist layer into a lens shape having a convex top surface;
    simultaneously etching the reflowed photoresist layer and the conductive layer, thereby forming a floating gate with a convex top surface;
    forming a gate oxide on the floating gate; and
    forming a concave control gate on the gate oxide.

2. The method of claim 1, wherein the reflowed photoresist layer and the conductive layer are etched at an etching selectivity of 1:1.

3. The method of claim 2, wherein the photoresist layer is reflowed at 200 to 300° C.

4. The method of claim 3, comprising allowing a thickness of the conductive layer to be adjusted depending on an etching selectivity of the photoresist layer and the conductive layer.

5. A method of forming a floating gate in a flash memory device, the method comprising the steps of:
    forming a tunnel oxide layer on a semiconductor substrate;
    forming a conductive layer on the tunnel oxide layer;
    patterning a photoresist layer on the conductive layer, thereby defining a floating gate area;
    selectively removing less than an entire thickness of the conductive layer using the patterned photoresist layer as a mask;
    reflowing the photoresist layer sufficiently to provide the photoresist layer with a convex top surface;
    substantially non-selectively etching the reflowed photoresist layer and the conductive layer, thereby forming a floating gate with a convex top surface;
    forming a gate oxide on the floating gate; and
    forming a concave control gate on the gate oxide.

6. The method of claim 5, wherein the reflowed photoresist layer and the conductive layer are etched at an etching selectivity of about 1:1.

7. The method of claim 5, wherein the photoresist layer is reflowed at 200 to 300° C.

8. The method of claim 5, wherein forming the gate oxide comprises thermal oxidation of the floating gate or chemical vapor deposition of a silicon oxide on the floating gate.

9. The method of claim 5, wherein forming the control gate comprises depositing a silicon layer on the gate oxide, patterning a second photoresist on the silicon layer, and etching the silicon layer using the patterned second photoresist as a mask.

10. The method of claim 9, wherein the patterned second photoresist has a width greater than that of the gate oxide and floating gate taken together.

11. The method of claim 1, wherein forming the gate oxide comprises thermal oxidation of the floating gate or chemical vapor deposition of a silicon oxide on the floating gate.

12. The method of claim 1, wherein forming the control gate comprises depositing a silicon layer on the gate oxide, patterning a second photoresist on the silicon layer, and etching the silicon layer using the patterned second photoresist as a mask.

13. The method of claim 12, wherein the patterned second photoresist has a width greater than that of the gate oxide and floating gate taken together.

* * * * *